(12) United States Patent
Jang et al.

(10) Patent No.: US 6,261,957 B1
(45) Date of Patent: Jul. 17, 2001

(54) SELF-PLANARIZED GAP-FILLING BY HDPCVD FOR SHALLOW TRENCH ISOLATION

(75) Inventors: Syun-Ming Jang, Hsin-Chu; Chu-Yun Fu, Taipei, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/378,496

(22) Filed: Aug. 20, 1999

(51) Int. Cl.$^7$ .................................................. H01L 21/00
(52) U.S. Cl. ............................. 438/692; 216/88; 216/38; 438/745
(58) Field of Search .................................... 438/691, 692, 438/693, 697, 723, 724, 743, 744, 745; 216/38, 88, 89; 204/192.32, 192.37

(56) References Cited

U.S. PATENT DOCUMENTS

| | | | |
|---|---|---|---|
| 5,182,221 | 1/1993 | Sato | 437/67 |
| 5,242,853 | 9/1993 | Sato et al. | 437/67 |
| 5,494,854 | 2/1996 | Jain | 437/195 |
| 5,686,356 | 11/1997 | Jain et al. | 437/195 |
| 6,001,740 | * 12/1999 | Varian et al. | 216/38 X |
| 6,060,394 | * 5/2000 | Wu | 216/38 X |

OTHER PUBLICATIONS

Chang et al., "ULSI Technology," The McGraw Hill Companies, Inc., New York, NY, pp. 422–423.

* cited by examiner

*Primary Examiner*—William Powell
(74) *Attorney, Agent, or Firm*—George O. Saile; Stephen B. Ackerman; Alek P. Szecsy

(57) ABSTRACT

Within a method for forming an aperture fill layer within an aperture there is first provided a topographic substrate which has formed therein a pair of mesas which defines an aperture. There is then formed over the topographic substrate and into the aperture a blanket aperture fill layer while employing a high density plasma chemical vapor deposition (HDP-CVD) method, where the blanket aperture fill layer is formed to a thickness greater than a depth of the aperture while forming a pair of protrusions over the pair of mesas. There is then etched, while employing a sputter etch method, the blanket aperture fill layer to form an etched blanket aperture fill layer such that the pair of protrusions of the blanket aperture fill layer formed over the pair of mesas is etched more rapidly than a portion of the blanket aperture fill layer formed within the aperture. Finally, there is then chemical mechanical polish (CMP) planarized the etched blanket aperture fill layer to form a patterned planarized aperture fill layer within the aperture while removing the pair of protrusions form over the pair of mesas. The method may be employed to form with enhanced planarity and attenuated residue formation a trench isolation region within an isolation trench within a semiconductor substrate employed within a semiconductor integrated circuit microelectronic fabrication.

15 Claims, 3 Drawing Sheets

SELF-PLANARIZED GAP-FILLING BY HDPCVD FOR SHALLOW TRENCH ISOLATION

BACKGROUND OF THE INVENTION

1. Field of the Invention

The present invention relates generally to methods for forming aperture fill layers within apertures within substrates employed within microelectronic fabrications. More particularly, the present invention relates to methods for forming planarized aperture fill layers within apertures within substrates employed within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become common in the art of microelectronic fabrication, and in particular within the art of semiconductor integrated circuit microelectronic fabrication, to employ trench isolation methods, such as but not limited to shallow trench isolation (STI) methods and recessed oxide isolation (ROI) methods, to form within isolation trenches within semiconductor substrates employed within semiconductor integrated circuit microelectronic fabrications trench isolation regions which are nominally co-planar with adjoining active regions of the semiconductor substrate within which are formed the trench isolation regions. Trench isolation regions which are nominally co-planar with adjoining active regions of a semiconductor substrate are desirable within the art of semiconductor integrated circuit microelectronic fabrication, since such trench isolation regions when nominally co-planar with adjoining active regions of a semiconductor substrate most favorably accommodate an attenuated depth of focus of a photoexposure apparatus typically employed in defining patterned microelectronic layers upon the semiconductor substrate having the nominally co-planar isolation regions and active regions formed therein.

Of the methods for forming trench isolation regions nominally co-planar with adjoining active regions of a semiconductor substrate within which are formed those trench isolation regions, high density plasma chemical vapor deposition (HDP-CVD) methods when employed in conjunction with planarizing methods, such as but not limited to chemical mechanical polish (CMP) planarizing methods, are presently of particular interest. High density plasma chemical vapor deposition (HDP-CVD) methods are understood in the art as plasma enhanced chemical vapor deposition (PECVD) methods undertaken simultaneously with bias sputtering methods, where a deposition rate within a plasma enhanced chemical vapor deposition (PECVD) method employed within a high density plasma chemical vapor deposition (HDP-CVD) method is greater than a sputtering rate within a bias sputtering method employed within the high density plasma chemical vapor deposition (HDP-CVD) method. High density plasma chemical vapor deposition (HDP-CVD) methods are presently of considerable interest in conjunction with planarizing methods for forming trench isolation regions within isolation trenches within semiconductor substrates since high density plasma chemical vapor deposition (HDP-CVD) methods typically provide superior gap filling properties when forming a blanket trench fill dielectric layer upon a semiconductor substrate and within an isolation trench within the semiconductor substrate, from which blanket trench fill dielectric layer upon planarizing is formed a trench isolation region within the isolation trench within the semiconductor substrate.

While trench isolation regions formed employing high density plasma chemical vapor deposition (HDP-CVD) methods in conjunction with planarizing methods, and in particular chemical mechanical polish (CMP) planarizing methods, are thus desirable within the art of microelectronic fabrication for forming isolation regions nominally co-planar with adjoining active regions of a semiconductor substrate, high density plasma chemical vapor deposition (HDP-CVD) methods in conjunction, in particular, with chemical mechanical polish (CMP) planarizing methods are nonetheless not entirely without problems within the art of semiconductor integrated circuit microelectronic fabrication for forming trench isolation regions nominally co-planar with adjoining active regions of a semiconductor substrate within which are formed those trench isolation regions. In that regard, trench isolation regions formed from blanket trench fill dielectric layers formed employing high density plasma chemical vapor deposition (HDP-CVD) methods, since such blanket trench fill dielectric layers are typically formed with uniquely irregular surface profiles, are often difficult to effectively planarize, such as chemical mechanical polish (CMP) planarize, to form chemical mechanical polish (CMP) planarized high density plasma chemical vapor deposited (HDP-CVD) trench isolation regions with uniform planarity of the trench isolation region and minimal residue formation over portions of the semiconductor substrate adjacent the trench isolation region.

It is thus towards the goal of forming within isolation trenches within semiconductor substrates employed within semiconductor integrated circuit microelectronic fabrications planarized high density plasma chemical vapor deposited (HDP-CVD) trench isolation regions with uniform planarity and minimal residue formation that the present invention is more specifically directed. In a more general sense, the present invention is also directed towards providing methods for forming within apertures within topographic substrates employed within microelectronic fabrications plannarized high density plasma chemical vapor deposited (HDP-CVD) aperture fill layers with enhanced planarity and minimal residue formation.

Various methods have been disclosed within the art of microelectronic fabrication for forming microelectronic layers with desirable properties within microelectronic fabrications.

For example, Liu, in *ULSI Technology*, C. Y. Chang & S. M. Sze, eds., McGraw-Hill, 1997, pp. 422–23, discloses, in general, characteristics of high density plasma chemical vapor deposition (HDP-CVD) methods for forming silicon oxide layers within semiconductor integrated circuit microelectronic fabrications.

In addition, Sato, in U.S. Pat. No. 5,182,221, discloses a bias electron cyclotron resonance high density plasma chemical vapor deposition (ECR-HDP-CVD) method for forming within an aperture within a substrate layer employed within a microelectronic fabrication an aperture fill material without increase in aspect ratio of the aperture and without void formation within the aperture fill material formed within the aperture. The electron cyclotron resonance high density plasma chemical vapor deposition (ECR-HDP-CVD) method realizes the foregoing objects by employing within the electron cyclotron resonance high density plasma chemical vapor deposition (ECR-HDP-CVD) method a vertical:horizontal deposition rate ratio equal to two times a depth of the aperture divided by a width of the aperture.

Further, Sato et al., in U.S. Pat. No. 5,242,853, discloses an additional electron cyclotron resonance high density plasma chemical vapor deposition (ECR-HDP-CVD) method for forming within a trench within a substrate employed within a microelectronic fabrication a patterned planarized trench fill dielectric layer while effectively removing portions of the trench fill dielectric layer residues formed upon portions of the substrate adjoining the trench. The method employs a lateral directional etch method to remove portions of a blanket electron cyclotron resonance high density plasma chemical vapor deposited (ECR-HDP-CVD) dielectric layer formed upon edges of the substrate adjoining the trench, prior to masking portions of the electron cyclotron resonance high density plasma chemical vapor deposited (ECR-HDP-CVD) dielectric layer formed within the trench and subsequently etching the trench fill dielectric layer residues formed upon portions of the substrate adjoining the trench.

Still further, Jain, in U.S. Pat. No. 5,494,854, discloses a method for forming, with enhanced manufacturing throughput, enhanced gap filling characteristics and enhanced planarity, a planarized inter-level dielectric (ILD) layer formed interposed in-part between the patterns of a patterned conductor layer within a semiconductor integrated circuit microelectronic fabrication. The method employs when forming the planarized inter-level dielectric (ILD) layer a bilayer inter-level dielectric (ILD) layer comprising: (1) a planarizing first dielectric layer formed at least in part interposed between the patterns of the patterned conductor layer, the planarizing first dielectric layer being formed employing a high density plasma chemical vapor deposition (HDP-CVD) method, the planarizing first dielectric layer in turn having formed thereupon; (2) a conformal dielectric polish layer which polishes at a rate greater than the planarizing first dielectric layer. The bilayer inter-level dielectric layer is then polished employing a chemical mechanical polish (CMP) planarizing method to form a planarized bi-layer inter-level dielectric (ILD) layer with the above noted desirable properties.

Finally, Jain et al., in U.S. Pat. No. 5,686,356, discloses a method for forming, with enhanced planarity, a planarized inter-level dielectric (ILD) layer planarizing a patterned conductor layer within a microelectronic fabrication. The method employs a reticulated patterned conductor layer of dimensions such that the planarized inter-level dielectric (ILD) layer when formed upon the reticulated patterned conductor layer is formed with enhanced planarity.

Desirable in the art of microelectronic fabrication are additional high density plasma chemical vapor deposition (HDP-CVD) methods and materials, which in conjunction with planarizing methods and materials may be employed to form within apertures within topographic substrate layers employed within microelectronic fabrications planarized aperture fill layers with enhanced planarity and attenuated residue formation. More particularly desirable in the art of microelectronic fabrication are additional high density plasma chemical vapor deposition (HDP-CVD) methods, which in conjunction with planarizing methods may be employed to form within isolation trenches within semiconductor substrates trench isolation regions with enhanced planarity and attenuated residue formation.

It is towards the foregoing objects that the present invention is both generally and more specifically directed.

SUMMARY OF THE INVENTION

A first object of the present invention is to provide a high density plasma chemical vapor deposition (HDP-CVD) method for forming a planarized aperture fill layer within an aperture within a topographic substrate layer employed within a microelectronic fabrication.

A second object of the present invention is tor provide a method in accord with the first object of the present invention, where the planarized aperture fill layer is formed with enhanced planarity and attenuated residue formation.

A third object of the present invention is to provide a method in accord with the first object of the present invention and the second object of the present invention, which method is readily commercially implemented.

In accord with the objects of the present invention, there is provided by the present invention a method for forming an aperture fill layer within an aperture. To practice the method of the present invention, there is first provided a topographic substrate, where the topographic substrate has formed therein a pair of mesas which defines an aperture. There is then formed over the topographic substrate and into the aperture a blanket aperture fill layer while employing a high density plasma chemical vapor deposition (HDP-CVD) method. The blanket aperture fill layer is formed to a thickness greater than a depth of the aperture while forming a pair of protrusions over the pair of mesas. There is then sputter etched, while employing a sputter etch method, the blanket aperture fill layer to form an etched blanket aperture fill layer such that the pair of protrusions of the blanket aperture fill layer formed over the pair of mesas is etched more rapidly than a portion of the blanket aperture fill layer formed within the aperture (i.e., the etched blanket aperture fill layer is a smoothed in comparison with the blanket aperture fill layer). Finally, there is then chemical mechanical polish (CMP) planarized the etched blanket aperture fill layer to form a patterned planarized aperture fill layer within the aperture while removing the pair of protrusions from over the pair of mesas.

The method may be employed for forming a trench isolation region within an isolation trench within a semiconductor substrate employed within a semiconductor integrated circuit microelectronic fabrication.

The present invention provides a high density plasma chemical vapor deposition (HDP-CVD) method for forming a planarized aperture fill layer within an aperture within a topographic substrate employed within a microelectronic fabrication, where the planarized aperture fill layer is formed with enhanced planarity and attenuated residue formation. The present invention realizes the foregoing objects by employing after forming a blanket aperture fill layer while employing a high density plasma chemical vapor deposition (HDP-CVD) to form the blanket aperture fill layer having a pair of protrusions over a pair of mesas which define an aperture within a topographic substrate layer within which aperture is formed the blanket aperture fill layer a sputter etching of the blanket aperture fill layer such that the pair of protrusions of the blanket aperture fill layer is etched at a rate faster than a portion of the blanket aperture fill layer formed within the aperture. The etched blanket aperture fill layer thus formed is then chemical mechanical polish (CMP) planarized, with enhanced chemical mechanical polish (CMP) planarizing process margin incident to sputter etching of the blanket aperture fill layer, to form a patterned planarized aperture fill layer within the aperture, where the patterned planarized aperture fill layer is formed within the aperture with enhanced planarity and with attenuated residue formation over portions of the topographic substrate adjoining the aperture.

The method of the present invention is readily commercially implemented. The present invention employs methods and materials as are either generally known within, or readily adapted to, the art of microelectronic fabrication. Since it is thus a process control and microelectronic fabrication method selection which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, which follows. The Description of the Preferred Embodiment is understood within the context of the accompanying drawings, which form a material part of this disclosure, wherein.

DESCRIPTION OF THE PREFERRED EMBODIMENTS

The present invention provides a high density plasma chemical vapor deposition (HDP-CVD) method for forming a planarized aperture fill layer within an aperture within a topographic substrate employed within a microelectronic fabrication, where the planarized aperture fill layer is formed with enhanced planarity and attenuated residue formation. The present invention realizes the foregoing objects by employing after forming a blanket aperture fill layer while employing a high density plasma chemical vapor deposition (HDP-CVD) to form the blanket aperture fill layer having a pair of protrusions over a pair of mesas which define an aperture within a topographic substrate layer within which aperture is formed the blanket aperture fill layer a sputter etching of the blanket aperture fill layer such that the pair of protrusions of the blanket aperture fill layer is etched at a rate faster than a portion of the blanket aperture fill layer formed within the aperture. The etched blanket aperture fill layer thus formed is then chemical mechanical polish (CMP) planarized to form a patterned planarized aperture fill layer within the aperture, where the patterned planarized aperture fill layer has enhanced planarity and attenuated residue formation over portions of the topographic substrate adjacent the aperture.

The method of the present invention may be employed for forming planarized aperture fill layers within apertures within topographic substrates employed within microelectronic fabrications including but not limited to integrated circuit microelectronic fabrications, ceramic substrate microelectronic fabrications, solar cell optoelectronic microelectronic fabrications, sensor image array optoelectronic fabrications and display image array optoelectronic fabrications.

First Preferred Embodiment

Figure 1:
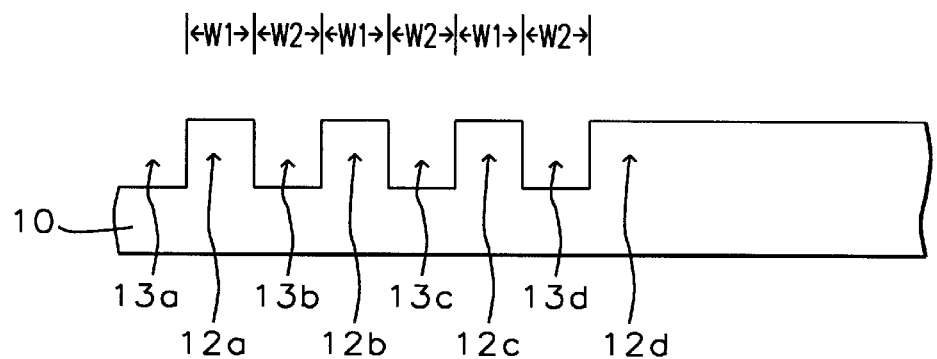
FIG. 1, FIG. 2, FIG. 3 and FIG. 4 shown a series of schematic cross-sectional diagrams illustrating the results of forming, in accord with a general embodiment of the present invention which comprises a first preferred embodiment of the present invention which is a less preferred embodiment of the present invention, a series of patterned planarized aperture fill layers within a series of apertures within a topographic substrate employed within a microelectronic fabrication.

Referring now to FIG. 1 to FIG. 4, there is shown a series of schematic cross-sectional diagrams illustrating the results of forming, in accord with a general embodiment of the present invention which comprises a first preferred embodiment of the present invention which is a less preferred embodiment of the present invention, a series of patterned planarized aperture fill layers within a series of apertures within a topographic substrate layer employed within a microelectronic fabrication. Shown in FIG. 1 is a schematic cross-sectional diagram of the microelectronic fabrication at an early stage in its fabrication in accord with the first preferred embodiment of the present invention.

Shown in FIG. 1 is a topographic substrate 10, having formed therein a series of comparatively narrow mesas 12a, 12b, and 12c, and a comparatively wide mesa 12d, where the series of comparatively narrow mesas 12a, 12b and 12c and the comparatively wide mesa 12d are separated by a series of apertures 13a, 13b, 13c and 13d.

Within the first preferred embodiment of the present invention, the topographic substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the topographic substrate 10 may be formed from microelectronic materials selected from the group including but not limited to microelectronic conductor materials, microelectronic semiconductor materials, microelectronic dielectric materials, and composites of microelectronic conductor materials, microelectronic semiconductor materials and microelectronic dielectric materials. With respect to composites of microelectronic conductor materials, microelectronic semiconductor materials and microelectronic dielectric materials, for example and without limitation, it is plausible within the present invention that the mesas 12a, 12b, 12c and 12d within the microelectronic fabrication whose schematic cross-sectional diagram is illustrated within FIG. 1 may be formed of a microelectronic conductor material in turn formed upon a nominally planar lower lying portion of the topographic substrate 10 formed of a microelectronic dielectric material. In the alternative, similarly also for example and without limitation, it is also feasible that the topographic substrate 10 may be formed of a single microelectronic material having the series of apertures 13a, 13b, 13c and 13d formed therein.

Although also not specifically illustrated within the schematic cross-sectional diagram of FIG. 1, the topographic substrate 10, typically and preferably when the topographic substrate 10 comprises at least in part a semiconductor substrate employed within a semiconductor integrated circuit microelectronic fabrication, has formed therein and/or thereupon microelectronic devices as are convention within the microelectronic fabrication within which is employed the topographic substrate 10. Such microelectronic devices may include, but are not limited to resistors, transistors, diodes and capacitors.

Finally, as is illustrated within the schematic cross-sectional diagram of FIG. 1, within the topographic substrate 10, the series of narrow mesas 12a, 12b and 12c is formed of a linewidth W1, typically and preferably of from about 0.2 to about 1 microns, while the series of apertures 13a, 13b, 13c and 13d is formed of an aperture width W2, typically and preferably of from about 0.2 to about 0.6 microns. Although not completely illustrated within the schematic cross-sectional diagram of FIG. 1, the comparatively wide mesa 12d typically and preferably has a linewidth of from about 2 to about 5 microns, and there may also be formed within the topographic substrate 10 comparatively wide apertures of aperture width from about 1 to about 3 microns. Within the present invention and the first preferred embodiment of the present invention there may be employed multiple linewidths of various mesas and multiple aperture widths of various apertures, although all of the apertures will typically and preferably have a nominally equivalent aperture depth of from about 3000 to about 5000 angstroms.

Figure 2:
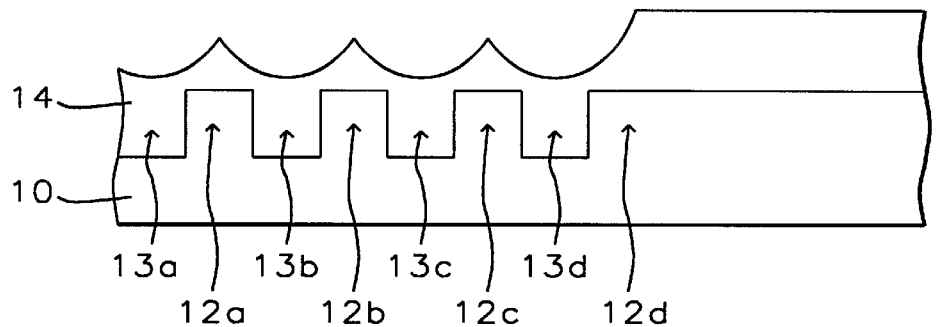

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed upon the topographic substrate layer 10 and filling the series of apertures 13a, 13b, 13c and 13d a blanket aperture fill layer 14 which is formed employing a high density plasma chemical vapor deposition (HDP-CVD) method. Characteristic to blanket aperture fill layers formed employing high density plasma chemical vapor deposition (HDP-CVD) methods over topographic substrate layers having formed therein mesas which define apertures is, as is illustrated within the schematic cross-sectional diagram of FIG. 2, the formation of a series of protrusions of the blanket aperture fill layer 14 over the series mesas 12a, 12b, 12c and 12d. As is illustrated within the schematic cross-sectional diagram of FIG. 2, the blanket aperture fill layer 14 is formed to a thickness greater than a depth of the apertures 13a, 13b, 13c and 13d. Typically and preferably, the blanket aperture fill layer 14 is formed to a thickness of from about 3500 to about 5500 angstroms at locations which completely fill each of the apertures 13a, 13b, 13c and 13d, which in turn yields a thickness of from about 5500 to about 6500 angstroms of the blanket aperture fill layer 14 over the comparatively wide mesa 12d.

The blanket aperture fill layer 14 may be formed employing the high density plasma chemical vapor deposition (HDP-CVD) method to form the blanket aperture fill layer 14 of a microelectronic material selected from the group including but not limited to microelectronic conductor materials, microelectronic semiconductor materials and microelectronic dielectric materials, although microelectronic dielectric materials are most commonly formed employing high density plasma chemical vapor deposition (HDP-CVD) methods.

Figure 3:
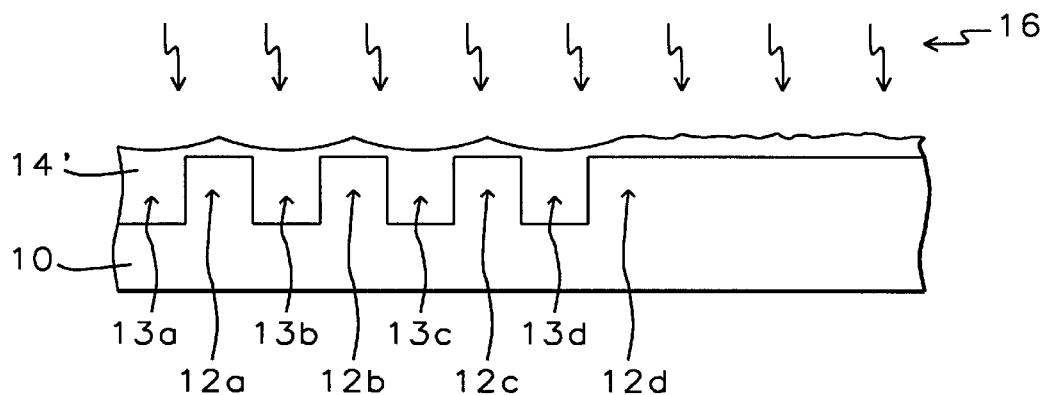

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein the blanket aperture fill layer 14 has been etched to form an etched blanket aperture fill layer 14' through etching with a sputter etchant 16. As is illustrated within the schematic cross-sectional diagram of FIG. 3 in comparison with the schematic cross-sectional diagram of FIG. 2, the protrusions of the blanket aperture fill layer 14 over the series of mesas 12a, 12b, 12c and 12d etch faster within the sputter etchant 16 in comparison with the portions of the blanket aperture fill layer 14 formed over and within the series of apertures 13a, 13b, 13c and 13d. Thus, incident to sputter etching the blanket aperture fill layer 14 to form the etched blanket aperture fill layer 14' through use of the sputter etchant 16, there is a substantial planarizing and smoothing of the blanket aperture fill layer 14 when forming the etched blanket aperture fill layer 14'.

Within the present invention and the first preferred embodiment of the present invention, for optimal control of profile of the etched blanket aperture fill layer 14' when employing the sputter etchant 16, there is typically and preferably employed a sputter etch method which employs a top radio frequency source power inductively coupled above the topographic substrate 10 and a side radio frequency source power inductively coupled at the periphery of the topographic substrate 10, within an appropriate reactor chamber. Thus, sputter etchant 16 will typically and preferably not be completely anisotropic or isotropic but will nonetheless etch all portions of the surface of the blanket aperture fill layer 14 when forming the etched blanket aperture fill layer 14'. Typically and preferably the sputter etchant 16 is provided in-situ within the same reactor chamber, or within adjoining reactor chambers within a multi-chamber "cluster" reactor tool, within which is formed upon the microelectronic fabrication whose schematic cross-sectional diagram is illustrated in FIG. 1 the blanket aperture fill layer 14 to provide the microelectronic fabrication whose schematic cross-sectional diagram is illustrated in FIG. 2.

As is illustrated within the schematic cross-sectional diagram of FIG. 3, when forming from the blanket aperture fill layer 14 as is illustrated within FIG. 2 the etched blanket aperture fill layer 14' as is illustrated within the schematic cross-sectional diagram of FIG. 3 there typically and preferably remains a thickness of the etched blanket aperture fill layer 14' over all portions of the topographic substrate 10, without an etching through to leave exposed portions of the mesas 12a, 12b, 12c and 12d at the edges of each of the apertures 13a, 13b, 13c and 13d.

Figure 4:
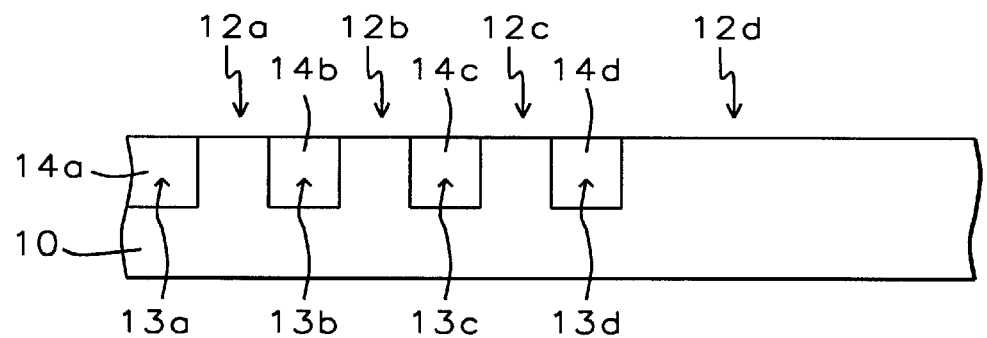

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the etched blanket aperture fill layer 14' is planarized to form a series of patterned planarized aperture fill layers 14a, 14b, 14c and 14d within the series of apertures 13a, 13b, 13c and 13d.

Within the present invention and the first preferred embodiment of the present invention, the etched blanket aperture fill layer 14' is planarized to form the series of patterned planarized aperture fill layers 14a, 14b, 14c and 14d within the series of apertures 13a, 13b, 13c and 13d while employing chemical mechanical polish (CMP) planarizing methods as are conventional in the art of microelectronic fabrication.

Upon forming the microelectronic fabrication whose schematic cross-sectional diagram is illustrated in FIG. 4, there is formed a microelectronic fabrication having formed within a series of apertures defined by a series of mesas within a topographic substrate employed within the microelectronic fabrication a series of patterned planarized aperture fill layers, where the series of patterned planarized aperture fill layers is formed with enhanced planarity and attenuated residue formation upon the series of mesas adjacent the series of apertures. The method of the present invention realizes this object by employing when forming the series of patterned planarized aperture fill layers from a corresponding blanket aperture fill layer formed employing a high density plasma chemical vapor deposition (HDP-CVD) method a sputter etching, preferably in-situ, of the blanket aperture fill layer to form an etched blanket aperture fill layer prior to chemical mechanical polish (CMP) planarizing the etched blanket aperture fill layer to form the series of patterned planarized aperture fill layers.

Second Preferred Embodiment

Figure 5:
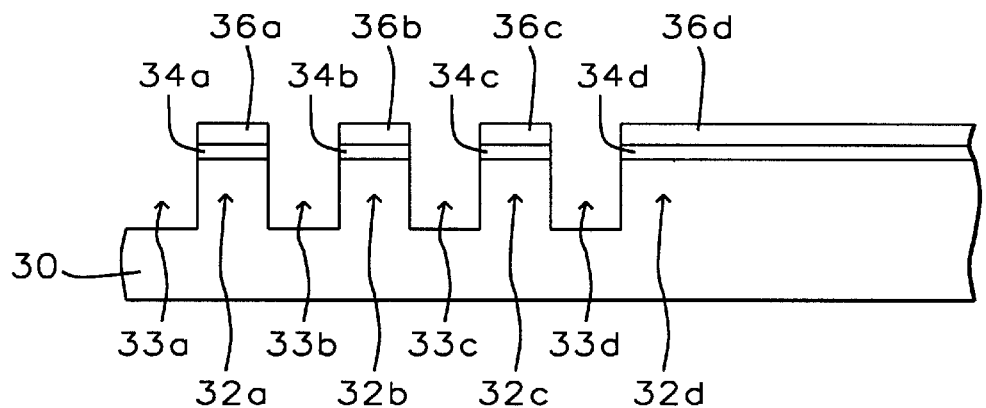
FIG. 5, FIG. 6, FIG. 7 and FIG. 8 show a series of schematic cross-sectional diagrams illustrating the results of forming, in accord with a more specific embodiment of the present invention which comprises a second preferred embodiment of the present invention which is a more preferred embodiment of the present invention, a series of trench isolation regions within a series of isolation trenches within a topographic semiconductor substrate employed within a semiconductor integrated circuit microelectronic fabrication.

Referring now to FIG. 5 to FIG. 8, there is shown a series of schematic cross-sectional diagrams illustrating the results of forming, in accord with a more specific embodiment of the present invention which comprises a second preferred embodiment of the present invention which is a more preferred embodiment of the present invention, a series of patterned planarized trench isolation regions within a series of isolation trenches within a semiconductor substrate employed within a semiconductor integrated circuit microelectronic fabrication. Shown in FIG. 5 is a schematic cross-sectional diagram of the semiconductor integrated circuit microelectronic fabrication at an early stage in its fabrication in accord with the second preferred embodiment of the present invention.

Shown in FIG. 5 is a semiconductor substrate 30 having formed therein a series of comparatively narrow mesas 32a, 32b and 32c, and a comparatively wide mesa 32d, which in an aggregate define a series of isolation trench apertures 33a, 33b, 33c and 33d.

Within the second preferred embodiment of the present invention with respect to the semiconductor substrate 30, although semiconductor substrates are known in the art of integrated circuit microelectronic fabrication with either dopant polarity, several dopant concentrations and various crystallographic orientations, for the second preferred embodiment of the present invention, the semiconductor substrate 30 is typically and preferably a (100) silicon semiconductor substrate having an N- or P-doping.

Similarly, although also not specifically illustrated within the schematic cross-sectional diagram of FIG. 5: (1) each mesa within the series of comparatively narrow mesas 32a, 32b and 32c; (2) the comparatively wide mesa 32d; (3) each isolation trench aperture 33a, 33b, 33c or 33d within the series of isolation trench apertures 33a, 33b, 33c and 33d; (4) as well as any additional comparatively wide isolation trench apertures not illustrated within the schematic cross-sectional diagram of FIG. 5, are formed with corresponding linewidth dimensions or aperture width dimensions analogous or equivalent to the linewidth dimensions and aperture width dimensions employed for forming the series of comparatively narrow mesas 12a, 12b and 12c, the comparatively wide mesa 12d, the series of apertures 13a, 13b, 13c and 13d and any additional comparatively wide apertures not otherwise illustrated, within the topographic substrate 10 within the first preferred embodiment of the present invention as illustrated within the schematic cross-sectional diagram of FIG. 1.

Shown also within FIG. 5 formed and aligned upon the corresponding series of comparatively narrow mesas 32a, 32b and 32c, and the comparatively wide mesa 32d, is a corresponding series of patterned pad oxide layers 34a, 34b, 34c and 34d having formed and aligned thereupon a corresponding series of patterned silicon nitride layers 36a, 36b, 36c and 36d.

Within the second preferred embodiment of the present invention with respect to the series of patterned pad oxide layers 34a, 34b, 34c and 34d, although it is known in the art of semiconductor integrated circuit microelectronic fabrication that patterned pad oxide layers may be formed through patterning, while employing methods as are conventional in the art of semiconductor integrated circuit microelectronic fabrication, of blanket pad oxide layers formed employing methods including but not limited to blanket pad oxide thermal growth methods and blanket pad oxide deposition methods, for the second preferred embodiment of the present invention, the series of patterned pad oxide layers 34a, 34b, 34c and 34d is typically and preferably formed through patterning, while employing methods as are conventional in the art of semiconductor integrated circuit microelectronic fabrication, of a blanket silicon oxide pad oxide layer formed through thermal oxidation of the semiconductor substrate 30 at a temperature of from about 900 to about 1000 degrees centigrade to form the blanket silicon oxide pad oxide layer of thickness about 70 to about 130 angstroms.

Similarly, although it is also known in the art of semiconductor integrated circuit microelectronic fabrication that patterned silicon nitride layers may be formed through patterning, while employing methods as are conventional in the art of semiconductor integrated circuit microelectronic fabrication, of blanket silicon nitride layers formed employing methods including but not limited to chemical vapor deposition (CVD) methods, plasma enhanced chemical vapor deposition (PECVD) methods and thermal nitridation methods, for the second preferred embodiment of the present invention, the patterned silicon nitride layers 36a, 36b, 36c and 36d are typically and preferably formed through patterning, while employing methods as are conventional in the art of semiconductor integrated circuit microelectronic fabrication, of a blanket silicon nitride layer formed employing a chemical vapor deposition (CVD) method employing silane as a silicon source material and ammonia as a nitrogen source material as is otherwise conventional in the art of semiconductor integrated circuit microelectronic fabrication. Typically and preferably the blanket silicon nitride layer is formed to a thickness of from about 800 to about 1800 angstroms.

Figure 6:
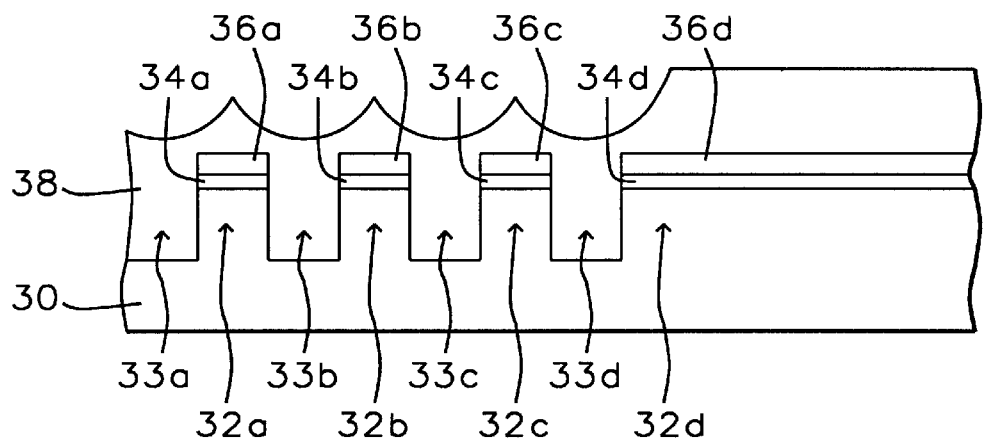

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein there is formed over the semiconductor substrate 30 and filling each of the isolation trenches 33a, 33b, 33c and 33d a blanket trench fill dielectric layer 38. Within the second preferred embodiment of the present invention, the blanket trench fill dielectric layer 38, similarly with the blanket aperture fill layer 14 within the first preferred embodiment of the present invention as illustrated within the schematic cross-sectional diagram of FIG. 2, is formed employing a high density plasma chemical vapor deposition (HDP-CVD) method. While it is feasible that the blanket trench fill dielectric layer 38 may be formed employing a high density plasma chemical vapor deposition (HDP-CVD) method to form the blanket trench fill dielectric layer 38 of dielectric materials including but not limited to silicon oxide dielectric materials, silicon nitride dielectric materials and silicon oxynitride dielectric materials, for the second preferred embodiment of the present invention, the blanket trench fill dielectric layer 38 is typically and preferably formed of a silicon oxide trench fill dielectric material formed employing silane as a silicon source material, oxygen as an oxidant source material and argon as a sputter source material.

When forming the blanket trench fill dielectric layer 38 upon an eight inch diameter semiconductor substrate 30, the high density plasma chemical vapor deposition (HDP-CVD) method also employs: (1) a reactor chamber pressure of from about 5 to about 12 mtorr; (2) a top source radio frequency power of from about 1000 to about 1500 watts and a side source radio frequency power of from about 3000 to about 3500 watts at a top and a side source radio frequency of 2 MHZ; (3) a bias power of from about 2000 to about 3500 watts; (4) a semiconductor substrate 30 temperature of from about 650 to about 750 degrees centigrade; (5) a top silane flow rate of from about 5 to about 20 standard cubic centimeters per minute (sccm) and a side silane flow rate of from about 70 to about 120 standard cubic centimeters per minute (sccm); (6) a top oxygen flow rate of from about 15 to about 40 standard cubic centimeters per minute (sccm) and a side oxygen flow rate of from about 150 to about 240 standard cubic centimeters per minute (sccm); and (7) a top argon flow rate of from about 2 to about 20 standard cubic centimeters per minute (sccm) and a side argon flow rate of from about 15 to about 120 standard cubic centimeters per minute (sccm). Typically and preferably, the blanket trench fill dielectric layer 38 is formed to a thickness of at least about 5000 to about 8000 angstroms over the semiconductor substrate 30 while more than completely filling each of the isolation trench apertures 33a, 33b, 33c and 33d.

Figure 7:
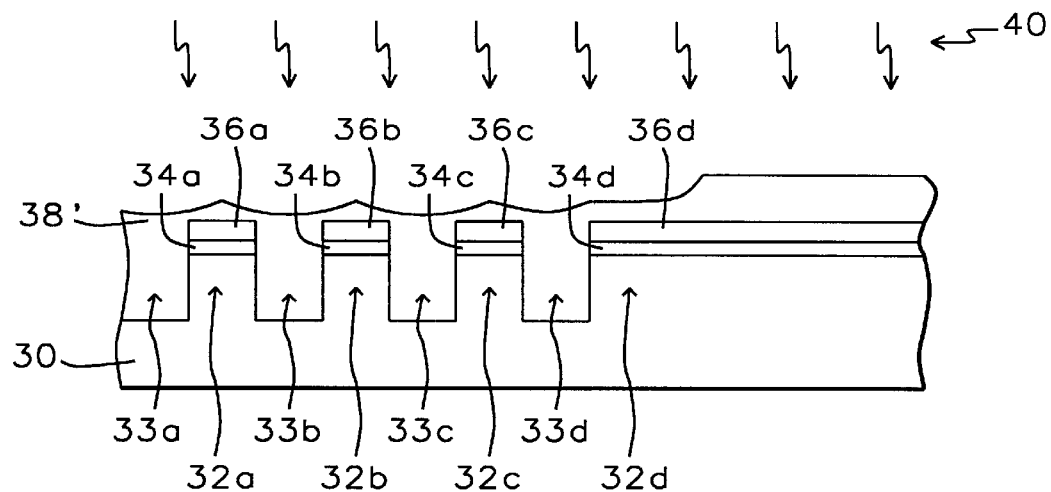

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein the blanket trench fill dielectric layer 38 has been etched within a sputter etchant 40 to form an etched blanket trench fill dielectric layer 38'.

Within the second preferred embodiment of the present invention, similarly with the first preferred embodiment of the present invention, the sputter etchant 40 employs a first inductively coupled source radio frequency power incident upon the semiconductor substrate 30 at the top of the semiconductor substrate 30, an independently variable second inductively coupled source radio frequency power incident upon the semiconductor substrate 30 at the periphery of the semiconductor substrate 30, as well as a bias power. Similarly, the sputter etchant 40 typically and preferably, but not exclusively, employs an inert sputter etchant such as but not limited to an argon inert sputtering etchant, although other inert and non-inert sputter etchants may also be employed, such as but not limited to nitrogen and oxygen sputter etchants.

When etching the blanket trench fill dielectric layer 38 to form the etched blanket trench fill dielectric layer 38' over an eight inch diameter semiconductor substrate 30, while employing the sputter etchant 40 within a sputter etch method, the sputter etch method also employs: (1) a reactor chamber pressure of from about 8 to about 12 mtorr; (2) a top source radio frequency power of from about 1000 to about 1500 watts and a side source radio frequency power of from about 3000 to about 3500 watts at a top source and a side source radio frequency of 2 MHZ; (3) a bias power of from about 2000 to about 3500 watts; (4) a semiconductor substrate 30 temperature of from about 650 to about 750 degrees centigrade; (5) a top argon sputtering gas flow rate of from about 2 to about 20 standard cubic centimeters per minute (sccm) and a side argon sputtering gas flow rate of from about 15 to about 120 standard cubic centimeters per minute (sccm); and (6) an optional top oxygen flow rate of from about 15 to about 40 standard cubic centimeters per minute (sccm) and an optional side oxygen flow rate of from about 150 to about 240 standard cubic centimeters per minute (sccm).

Upon forming from the blanket trench fill dielectric layer 38 as illustrated within the schematic cross-sectional diagram of FIG. 6 the etched blanket trench fill dielectric layer 38' as illustrated within the schematic cross-sectional diagram of FIG. 7 through etching with the sputter etchant 40, the etched blanket trench fill dielectric layer 38' is typically and preferably formed with a substantially uniform (i.e., within about 3 percent uniformity as measured on a planar substrate) thickness of from about 2000 to about 2800 angstroms over all portions of each of the mesas 32a, 32b, 32c and 32d. In order to assist in achieving such a substantially uniform thickness there may be adjusted, in part, the deposition thickness and other parameters when forming the blanket trench fill dielectric layer 38.

Similarly with the first preferred embodiment of the present invention, although also not specifically illustrated within the schematic cross-sectional diagrams of FIG. 6 and FIG. 7, the blanket trench fill dielectric layer 38 may be deposited and subsequently sputter etched to form the etched blanket trench fill dielectric layer 38' in-situ within a single high density plasma chemical vapor deposition (HDP-CVD) reactor chamber or in adjoining chambers within a single "cluster" reactor tool. Under such circumstances there is afforded additional process efficiency when forming the etched blanket trench fill dielectric layer 38' within the semiconductor integrated circuit microelectronic fabrication whose schematic cross-sectional diagram is illustrated in FIG. 3, while employing the sputter etchant 40.

Figure 8:
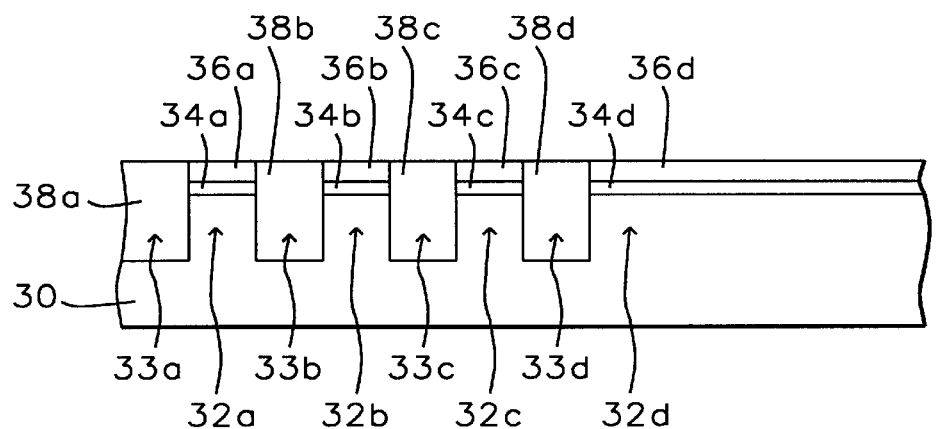

Referring now to FIG. 8, there is shown a schematic cross-sectional diagram illustrating the results of further processing of the semiconductor integrated circuit microelectronic fabrication whose schematic cross-sectional diagram is illustrated in FIG. 7.

Shown in FIG. 8 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 7, but wherein the etched blanket trench fill dielectric layer 38' has been planarized to form a series of patterned planarized trench isolation regions 38a, 38b, 38c and 38d within the series of isolation trenches 33a, 33b, 33c and 33d.

Similarly with the first preferred embodiment of the present invention, within the second preferred embodiment of the present invention, the etched blanket trench fill dielectric layer 38' may be planarized to form the patterned planarized trench isolation regions 38a, 38b, 38c and 38d while employing a chemical mechanical polish (CMP) planarizing method as is conventional in the art of microelectronic fabrication.

When chemical mechanical polish (CMP) planarizing the etched blanket trench fill dielectric layer 38' as illustrated within the schematic cross-sectional diagram of FIG. 7 to form the series of patterned planarized isolation regions 38a, 38b, 38c and 38d within the series of isolation trenches 33a, 33b, 33c and 33d upon an eight inch diameter semiconductor substrate 30, the chemical mechanical polish (CMP) planarizing method also employs: (1) a platen pressure of from about 3 to about 6 pounds per square inch (psi); (2) a platen rotation speed of from about 50 to about 80 revolutions per minute (rpm); (3) a head counter-rotation speed of from about 50 to about 80 revolutions per minute; (4) a polishing temperature of from about 20 to about 35 degrees centigrade; and (5) an aqueous silica polishing slurry composition comprising from about 6 to about 20 weight percent silica.

Upon forming the semiconductor integrated circuit microelectronic fabrication whose schematic cross-sectional diagram is illustrated in FIG. 8, there is formed a semiconductor integrated circuit microelectronic fabrication having formed within a series of isolation trenches within a semiconductor substrate defined by a series of mesas within the semiconductor substrate a series of trench isolation regions formed with greater planarity and attenuated residue formation of the trench isolation region material upon the mesas. The present invention realizes the foregoing objects by employing when forming the series of trench isolation regions from a corresponding blanket trench fill dielectric layer formed employing a high density plasma chemical vapor deposition (HDP-CVD) method a sputter etching of the blanket trench fill dielectric layer prior to chemical mechanical polish (CMP) planarizing the etched blanket trench fill dielectric layer to form the series of isolation regions.

As is understood by a person skilled in the art, the preferred embodiments of the present invention are illustrative of the present invention rather than limiting of the present invention. Revisions and modifications may be made to methods, materials, structures and dimensions through which are provided the preferred embodiments of the present invention while still providing embodiments which are within the spirit and scope of the present invention, as defined by the accompanying claims.

What is claimed is:

1. A method for forming an aperture fill layer within an aperture comprising:
   providing a topographic substrate, the topographic substrate having formed therein a pair of mesas which defines an aperture;
   forming over the topographic substrate and into the aperture a blanket aperture fill layer while employing a high density plasma chemical vapor deposition (HDP-CVD) method, the blanket aperture fill layer being formed to a thickness greater than a depth of the aperture while forming a pair of protrusions over the pair of mesas;
   etching, while employing a sputter etch method, the blanket aperture fill layer to form an etched blanket aperture fill layer such that the pair of protrusions of the blanket aperture fill layer formed over the pair of mesas is etched more rapidly than a portion of the blanket aperture fill layer formed within the aperture; and
   chemical mechanical polish (CMP) planarizing the etched blanket aperture fill layer to form a patterned planarized aperture fill layer within the aperture while removing the pair of protrusions form over the pair of mesas.

2. The method of claim 1 wherein by etching the blanket aperture fill layer to form the etched blanket aperture fill layer the patterned planarized aperture fill layer is formed with enhanced planarity and there is attenuated a formation of a residue of the blanket aperture fill layer formed over the mesas.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the topographic substrate layer is formed from a microelectronic material selected from the group consisting of microelectronic conductor materials, microelectronic semiconductor materials, microelectronic dielectric materials and composites of microelectronic conductor materials, microelectronic semiconductor materials and microelectronic dielectric materials.

5. The method of claim 1 wherein the blanket aperture fill layer is formed of an aperture fill material selected from the group consisting of aperture fill conductor materials, aperture fill semiconductor materials and aperture fill dielectric materials.

6. The method of claim 1 wherein the sputter etch method employs an argon sputtering ion.

7. The method of claim 6 wherein the sputter etch method simultaneously employs a top source radio frequency power within a reactor chamber and an independently variable side source radio frequency power within the reactor chamber.

8. The method of claim 1 wherein the deposition of the blanket aperture fill layer and the sputter etching of the blanket aperture fill layer to form the etched blanket aperture fill layer are undertaken sequentially in-situ within a single reactor chamber.

9. A method for forming a trench isolation region within an isolation trench comprising:
   providing a topographic semiconductor substrate, the topographic semiconductor substrate having formed therein a pair of mesas which defines an isolation trench;
   forming over the topographic semiconductor substrate and into the isolation trench a blanket trench fill dielectric layer while employing a high density plasma chemical vapor deposition (HDP-CVD) method, the blanket trench fill dielectric layer being formed to a thickness greater than a depth of the isolation trench while forming a pair of protrusions over the pair of mesas;
   etching, while employing a sputter etch method, the blanket trench fill dielectric layer to form an etched blanket trench fill dielectric layer such that the pair of protrusions of the blanket trench fill dielectric layer formed over the pair of mesas is etched more rapidly than a portion of the blanket trench fill dielectric layer formed within the isolation trench; and chemical mechanical polish (CMP) planarizing the etched blanket trench fill dielectric layer to form a trench isolation region within the isolation trench while removing the pair of protrusions form over the pair of mesas.

10. The method of claim 9 wherein by etching the blanket trench fill dielectric layer to form the etched blanket trench fill dielectric layer the trench isolation region is formed with enhanced planarity and there is attenuated a formation of a residue of the blanket trench fill dielectric layer formed over the mesas.

11. The method of claim 9 wherein the blanket trench fill dielectric layer is formed of a trench fill dielectric material selected from the group consisting of silicon oxide dielectric materials, silicon nitride dielectric materials and silicon oxynitride dielectric materials.

12. The method of claim 9 wherein the blanket trench fill dielectric layer is formed of a silicon oxide dielectric material deposited employing silane as a silicon source material, oxygen as an oxidant source material and argon as a sputter source material.

13. The method of claim 9 wherein the sputter etch method employs an argon sputtering ion.

14. The method of claim 13 wherein the sputter etch method simultaneously employs a top source radio frequency power within a reactor chamber and a side source radio frequency power within the reactor chamber.

15. The method of claim 9 wherein the deposition of the blanket trench fill dielectric layer and the etching of the blanket trench fill dielectric layer to form the etched blanket trench fill dielectric layer are undertaken sequentially in-situ within a single reactor chamber.

* * * * *